(12) United States Patent
Pezzani

(10) Patent No.: US 7,432,549 B2
(45) Date of Patent: Oct. 7, 2008

(54) DI/DT SERVO POWER SWITCHES

(75) Inventor: Robert Pezzani, Vouvray (FR)

(73) Assignee: STMicroelectronics S.A., Montrouge (FR)

( * ) Notice: Subject to any disclaimer, the term of this patent is extended or adjusted under 35 U.S.C. 154(b) by 590 days.

(21) Appl. No.: 10/470,024

(22) PCT Filed: Jan. 22, 2002

(86) PCT No.: PCT/FR02/00259

§ 371 (c)(1),
(2), (4) Date: Jul. 22, 2003

(87) PCT Pub. No.: WO02/059971

PCT Pub. Date: Aug. 1, 2002

(65) Prior Publication Data

US 2004/0056303 A1    Mar. 25, 2004

(30) Foreign Application Priority Data

Jan. 24, 2001  (FR) ................... 01 00935

(51) Int. Cl.
*H01L 29/76* (2006.01)
(52) U.S. Cl. .................... 257/328; 257/329; 257/536; 257/E27.013

(58) Field of Classification Search ............... 257/327, 257/326, 325, 328, 355, 175, 139, 480, 481, 257/329, 536, E27.013; 363/134; 318/92
See application file for complete search history.

(56) References Cited

U.S. PATENT DOCUMENTS

| | | | | |
|---|---|---|---|---|
| 3,938,013 | A * | 2/1976 | Seilly et al. | 318/92 |
| 4,628,438 | A * | 12/1986 | Montague | 363/134 |
| 5,349,232 | A * | 9/1994 | Mille et al. | 257/603 |
| 6,127,746 | A * | 10/2000 | Clemente | 307/131 |
| 6,326,648 | B1 * | 12/2001 | Jalade et al. | 257/130 |
| 6,666,380 | B1 * | 12/2003 | Suzuya | 235/492 |

FOREIGN PATENT DOCUMENTS

JP       10247718    *  9/1998

OTHER PUBLICATIONS

International Search Report from the corresponding PCT application No. PCT/FR02/00259, filed Jan. 22, 2002.

* cited by examiner

*Primary Examiner*—Thomas L. Dickey
*Assistant Examiner*—Fazli Erdem
(74) *Attorney, Agent, or Firm*—Lisa K. Jorgenson; James H. Morris; Wolf, Greenfield & Sacks, P.C.

(57) ABSTRACT

The invention relates to a vertical-type power switch disposed in a semi-conductor chip, comprising a winding (30) located on the periphery of at least one face of said chip. Said winding comprises two binding posts (31, 32) which supply a signal that is proportional to the current fluctuations in said switch.

18 Claims, 2 Drawing Sheets

DI/DT SERVO POWER SWITCHES

BACKGROUND OF THE INVENTION

1. Field of the Invention

The present invention relates to the switching of a load connected by a bidirectional switch to an A.C. network or by a one-way switch to an A.C. network rectified by a rectifying bridge. The present invention for example finds applications in the control of medium-power loads, for example, a vacuum cleaner motor, a temperature-controlled heating circuit, a dimmer lighting system, etc.

2. Discussion of the Related Art

FIG. 1 very schematically shows such a switching circuit. Load 1 is arranged between terminals A and B of an A.C. voltage or of a rectified A.C. voltage, in series with a power switch SW. Switch SW will be called a power switch, although it is, in the given examples, a medium-power switch intended for switching loads connected to the mains. Switch SW is controlled by a control circuit 2 receiving a control order, periodic or not, on a terminal 3. The control circuit is, for example, intended for turning on the switch for a portion only of a halfwave of the A.C. voltage across terminals A and B, which corresponds to a so-called phase angle control. Then, when the switch turns on, a strong current surge occurs in the load. In other words, the current variation along time (di/dt) is abrupt and the current exhibits strong peaks upon each turning-on of the switch.

These current peaks are capable of being sent back by terminals A and B onto the A.C. supply network and to disturb this network and other circuits connected to this network.

Conventionally, to attenuate these disturbances, an inductance L of relatively high value is provided in series with the switching circuit, which, independently from the cost of this inductance, which is a discrete component of relatively large dimension, complicates the circuit design.

U.S. Pat. No. 6,127,746 discloses a relatively complex circuit for detecting current peaks and controlling a MOS transistor so as to dampen these current peaks.

Japanese patent application 07/131316 provides for detecting overcurrents on an output pad of a MOS transistor by surrounding this pad with a winding, whereby the surface area of the semiconductor chip containing the transistor is substantially increased.

SUMMARY OF THE INVENTION

Thus, the present invention aims at solving the problem of sending back noise onto a supply source and the elements connected to this source without adding any discrete element such as a high-value inductance, without providing a complex circuit, and without increasing the surface area of the chip.

To solve this and other problems, the present invention provides a vertical-type power switch formed in a semiconductor chip, including a winding formed at the periphery of at least one surface of said chip, this winding including two connection terminals providing a signal proportional to the current variations in said switch.

According to an embodiment of the present invention, the switch further includes a resistor of high value arranged in or on the semiconductor chip.

According to an embodiment of the present invention, the switch is of bipolar transistor, MOS transistor, or insulated-gate bipolar transistor type.

According to an embodiment of the present invention, the switch is associated with a circuit for controlling a control signal of this switch according to the signal across said winding.

The foregoing objects, features and advantages of the present invention, will be discussed in detail in the following non-limiting description of specific embodiments in connection with the accompanying drawings, in which:

DETAILED DESCRIPTION

In the various drawings, the same elements are designated with the same references. Further, as usual, the cross-section and top views of semiconductor components are not drawn to scale.

Figure 1:
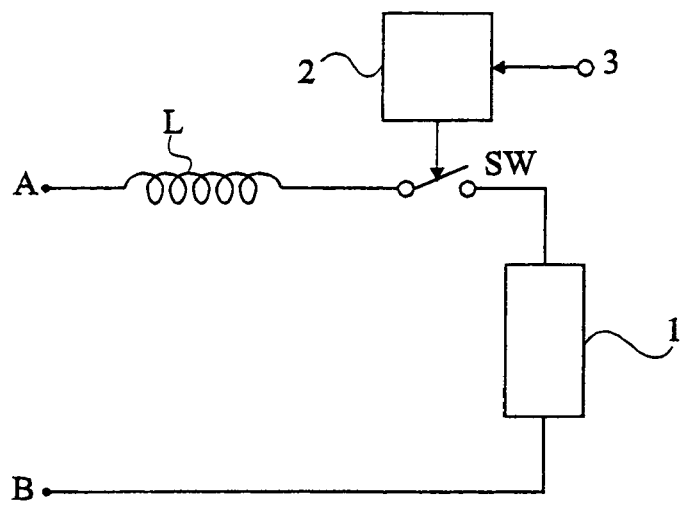
FIG. 1 schematically shows a switching circuit of a load according to prior art.
Figure 2:
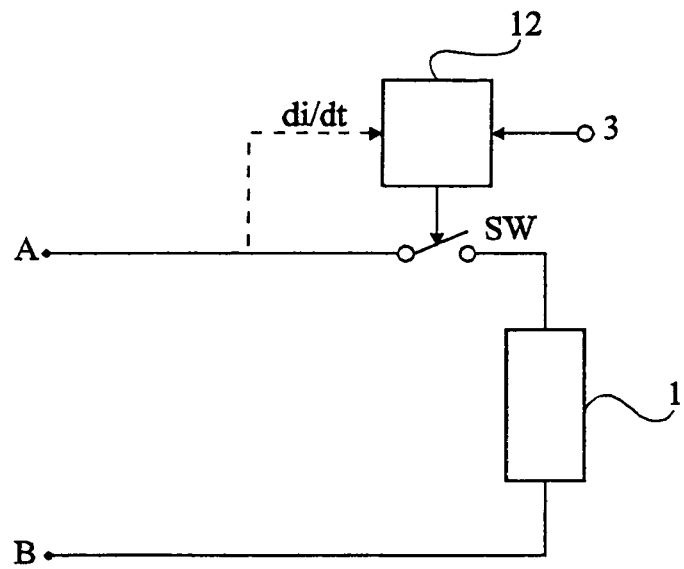
FIG. 2 schematically shows a load switching circuit associated with a current variation detector.

The present invention aims at forming in a simple way a circuit of the type illustrated in FIG. 2. In this circuit, a load I is connected between A.C. supply terminals A and B via a switch SW. Switch SW is controlled by a control circuit 12 receiving a turn-on signal 3 from a chosen time of each halfwave. The current variation di/dt in the charge circuit at the closing time is detected and a correction signal linked to the value of variation di/dt is applied to control circuit 12 so that this value di/dt does not exceed a determined threshold. The present invention provides forming the current variation detection circuit monolithically with power switch SW.

Figure 3A:
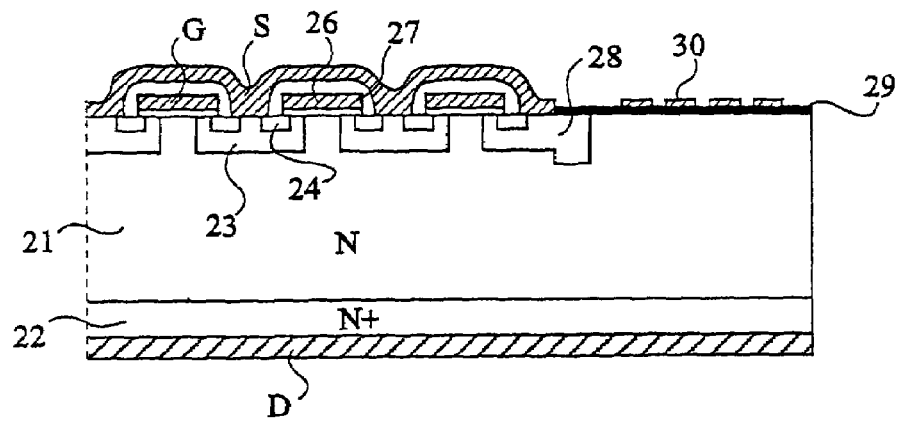
FIG. 3A is a partial cross-section view of an example of a switch according to the present invention.

An embodiment of the present invention is illustrated in the partial cross-section view of FIG. 3A in the case where the vertical power component is a MOS transistor.

The vertical MOS transistor is formed from an N-type substrate 21 including on its lower surface side a more heavily-doped N-type layer 22 covered with a drain metallization D. On the upper surface side are formed P-type wells 23. In each well is formed an N-type ring 24, the periphery of which extends close to the periphery of well 23. The area of well 23 between the periphery of this well and the external periphery of P-type region 24 is covered with a gate metallization 26 formed on an insulating layer 27. A source metallization is solid with the central portion of wells 23 and of rings 24. Thus, when no voltage is applied to gate electrode G, the component is off. When a voltage is applied to electrode G, a current can flow from source metallization S to drain metallization D, through area 24, a channel area formed in the external upper portion of well 23, then vertically through substrate 21 to N+ region 22.

A peripheral P-type region 28 deeper than wells 23 at the component periphery has also been shown. Area 28 or other peripheral means for ensuring that the breakdown of a vertical MOS transistor cannot occur at the periphery are known by those skilled in the art and are likely to have many alternatives. Such a periphery is necessary and corresponds to a lost, non active, surface area of the component.

A vertical MOS transistor has been shown hereabove as an example. The present invention could also be implemented with other vertical power switches such that the current flowing therethrough is linked to the voltage applied on their control electrode. Examples of such components are bipolar transistors, or insulated-gate bipolar transistors (IGBT) (it should be noted that the structure of an IGBT transistor only differs from the structure schematically shown in FIG. 3A by the fact that layer 22, instead of being heavily doped of the same conductivity type as the substrate, is heavily doped of the opposite conductivity type). Such other components also comprise a peripheral region for having a sufficiently high breakdown voltage.

According to the present invention, the component periphery is coated with a metallization 30 wound in successive spirals around the power component. Metallization 30 is insulated from substrate 21 by an insulating layer 29, for example made of silicon oxide.

Figure 3B:
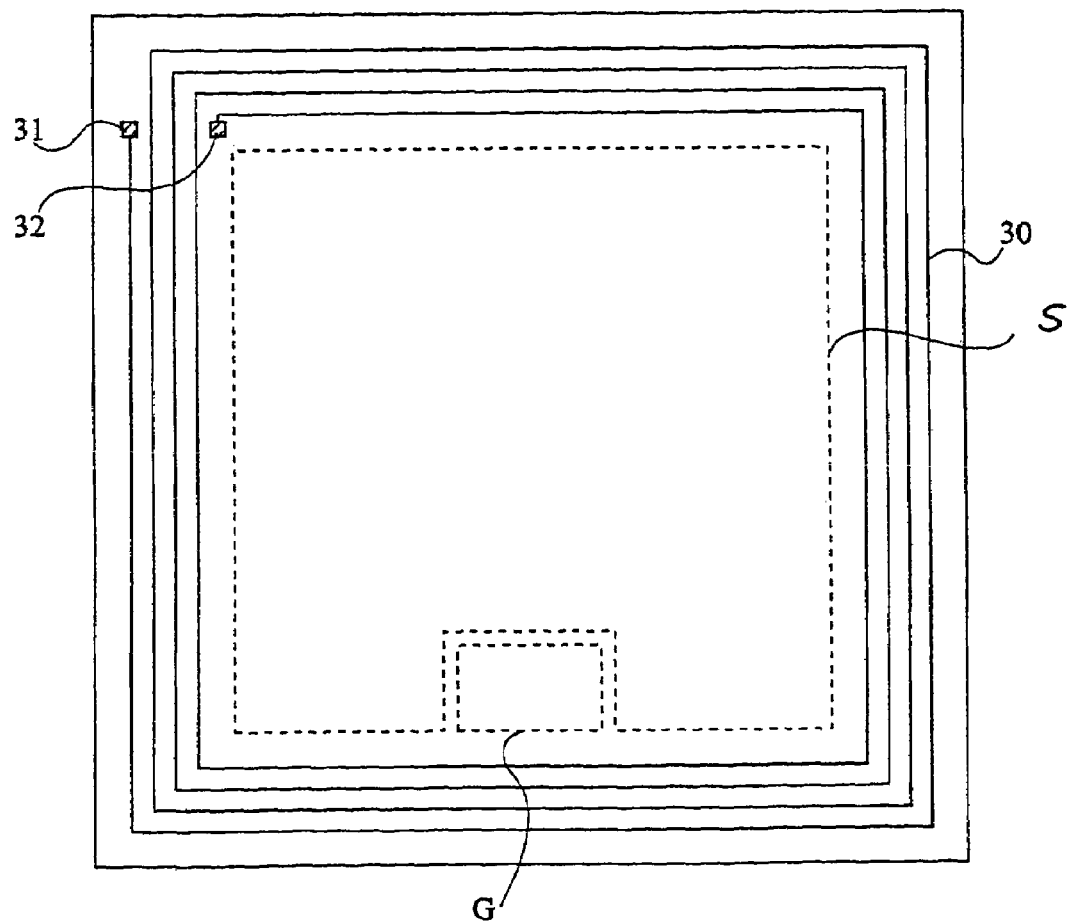
FIG. 3B is a simplified top view of an example of a switch according to the present invention.

Metallization 30 can be better seen in the top view of FIG. 3B where it extends between pads 31 and 32. The contour of source metallization S and the contour of a gate contact recovery G are also shown in FIG. 3B, in dotted lines.

When the component conducts a vertical current, variations of this current will generate across terminals 31, 32 of inductance 30 a signal proportional to the variation of this current. It should by the way be noted that this signal is detectable even if the current is not strictly vertical, provided that it does not remain in the spiral plane. A four-spiral winding has been shown in the drawing. Windings with more or less spirals could of course be provided according to the desired detection threshold.

To detect the signal between terminals 31 and 32, a resistor of very high value could for example be connected between terminals 31 and 32. This resistor may be arranged externally or may be formed monolithically on semiconductor chip 21 in the form of a polysilicon resistor or in any other way known of those skilled in the art.

Figure 4:
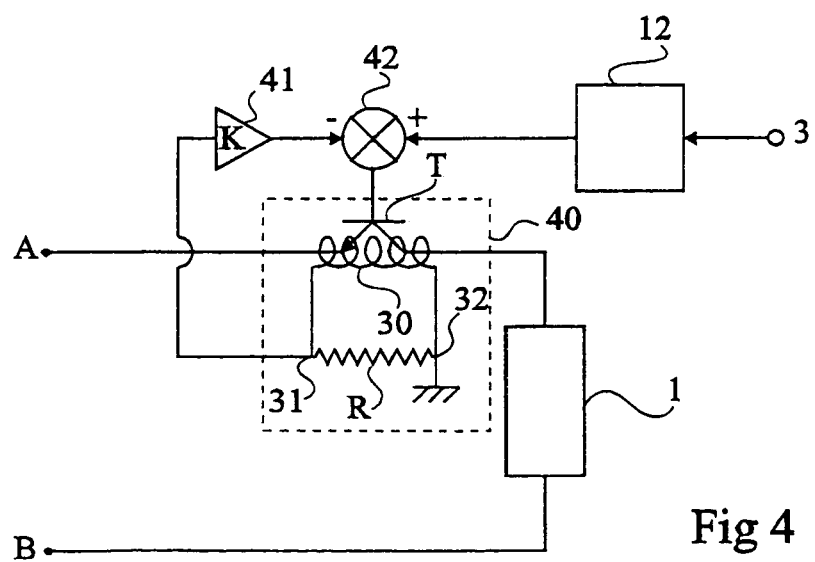
FIG. 4 shows a circuit for switching the current in a load according to the present invention.

FIG. 4 shows an example of use of a component according to the present invention in a circuit. In FIG. 4, this component has been generally designated with reference 40 and for example includes a power transistor T, a winding 30, and a resistor R monolithically integrated. Terminal 32 of winding 30 and of resistor R is grounded. Terminal 31 is connected via a multiplier 41 by a coefficient K to the subtraction input of an adder 42, the addition input of which receives the control signal from terminal 12. Thus, when an order is applied on input 3 of circuit 12, this order tends to turn transistor T on. A current variation then occurs in the circuit and signal di/dt is amplified/attenuated by amplifier 41 and combined with the control order to limit the turn-on speed of transistor T.

It should be understood that the control circuit of transistor T or another power switch is likely to have various alterations, modifications, and improvements which will readily occur to those skilled in the art. For example, to fulfil standards of sending back of noise on a supply network, a control circuit which performs different compensations according to the frequency of signal di/dt may be provided.

Further, the control circuit and the circuit for processing signal di/dt may be altogether integrated on the same semiconductor chip as that which contains the power component. Many other alternatives will occur to those skilled in the art, especially as concerns the component sizing.

According to an advantage of the present invention, the formation of winding 30 does not cause a loss in the surface area of the semiconductor chip as this winding is disposed above the periphery of the chip, which normally corresponds to a necessary, but non active, region.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. A semiconductor chip comprising:
   a vertical power switch; and
   a winding formed at the periphery of at least one surface of said chip, said winding including two connection terminals supplying a signal proportional to the current variations in said switch.

2. The semiconductor chip of claim 1, further including a resistor of high value arranged therein or on a surface of the semiconductor chip.

3. The semiconductor chip of claim 1, wherein the vertical power switch is of bipolar transistor, MOS transistor, or insulated-gate bipolar transistor type.

4. The semiconductor chip of claim 1, wherein the vertical power switch is associated with a circuit for controlling a control signal of this switch according to the signal across said winding.

5. An apparatus comprising:
   a semiconductor chip comprising a vertical power switch;
   at least one winding formed at a periphery of a first surface of the semiconductor chip; and
   a control circuit to control an amount of current in the vertical power switch;
   wherein the at least one winding comprises a first terminal and a second terminal, and the semiconductor chip further comprises a resistor connected between the first terminal and the second terminal.

6. The apparatus of claim 5, wherein the at least one winding is inductively coupled to the vertical power switch.

7. The apparatus of claim 5, wherein the at least one winding encompasses the vertical power switch.

8. An apparatus comprising:
   a semiconductor chip comprising a vertical power switch;
   at least one winding formed above the semiconductor chip at a periphery of a first surface of the semiconductor chip; and
   a control circuit to control an amount of current in the vertical power switch;
   further comprising:
   an insulating layer disposed between the first surface of the semiconductor chip and the at least one winding.

9. An apparatus comprising:
   a semiconductor chip comprising a vertical power switch;
   at least one winding providing a detection signal, the at least one winding being formed at a periphery of a first surface of the semiconductor chip; and
   a control circuit to control an amount of current in the vertical power switch;
   wherein the control circuit is configured to produce a control signal that controls the amount of current in the vertical power switch;
   wherein the amount of current in the vertical power switch is controlled in response to the control signal and the detection signal.

10. The apparatus of claim 9, further comprising:
    an adder having a first input to receive the control signal and a second input to receive the detection signal, wherein the detection signal corresponds to a current in the at least one winding.

11. The apparatus of claim 10, wherein the adder has an output connected to the vertical power switch.

12. A method of controlling a vertical power switch in a semiconductor chip, the method comprising:
  detecting a time rate of change of an amount of current through the vertical power switch; and
  controlling the amount of current through the vertical power switch in response to the time rate of change of the amount of current through the vertical power switch;
  wherein controlling the amount of current through the vertical power switch comprises using a control signal.

13. The method of claim 12, wherein the detection of the time rate of change of the amount of current through the vertical power switch is performed using a winding formed at a periphery of a first surface of the semiconductor chip.

14. The method of claim 13, wherein the detection of the time rate of change of the amount of current through the vertical power switch comprises generating a current in the winding.

15. The method of claim 14, wherein the winding is inductively coupled to the vertical power switch.

16. The method of claim 12, wherein the control signal is a combination of a first signal and a signal corresponding to the time rate of change of the amount of current through the vertical power switch.

17. The method of claim 16, wherein the signal corresponding to the time rate of change of the amount of current through the vertical power switch is generated by a winding formed at a periphery of a first surface of the semiconductor chip.

18. The method of claim 17, wherein the winding is inductively coupled to the vertical power switch.

* * * * *